United States Patent [19]

Beyer

[11] 3,798,081

[45] Mar. 19, 1974

[54] METHOD FOR DIFFUSING AS INTO SILICON FROM A SOLID PHASE

[75] Inventor: Klaus Dietrich Beyer, Poughkeepsie, N.Y.

[73] Assignee: International Business Machines Corporation, Armonk, N.Y.

[22] Filed: Feb. 14, 1972

[21] Appl. No.: 226,033

[52] U.S. Cl. .................. 148/188, 148/186, 148/187, 252/62.3 E

[51] Int. Cl. .............................................. H01l 7/34

[58] Field of Search .................... 148/188, 187, 186; 252/62.3 E

[56] References Cited

UNITED STATES PATENTS

| | | | |
|---|---|---|---|
| 3,690,969 | 9/1972 | Hays et al. | 148/186 |
| 3,574,009 | 4/1971 | Chizinsky et al. | 148/188 X |
| 3,660,156 | 5/1972 | Schmidt | 148/187 X |
| 3,615,936 | 10/1971 | Batz | 148/188 X |
| 3,055,776 | 9/1962 | Stevenson et al. | 148/189 |
| 3,646,665 | 3/1972 | Kim | 148/187 X |
| 3,477,886 | 11/1969 | Ehlenberger | 148/187 |
| 3,607,468 | 9/1971 | Chang et al. | 148/188 X |

*Primary Examiner*—G. T. Ozaki
*Attorney, Agent, or Firm*—Wolmar J. Stoffel

[57] ABSTRACT

A process for diffusing As into a silicon substrate forming diffused regions having a surface impurity concentration in excess of $10^{19}$ atoms/cc by forming a composite layer of an upper As doped glassy layer and an underlying $SiO_2$ layer at the interface of the substrate and glassy layer, and heating the substrate and layers in an inert atmosphere to diffuse the As from the solid phase glassy layer through the $SiO_2$ layer and into the substrate to the desired depth.

19 Claims, 2 Drawing Figures

METHOD FOR DIFFUSING AS INTO SILICON FROM A SOLID PHASE

BACKGROUND OF THE INVENTION

1. Field of the Invention

This invention relates to techniques for introducing an impurity into a semiconductor substrate, more particularly introducing an As impurity from the solid phase into a silicon semiconductor substrate in such concentrations that the surface concentration of the impurity in the substrate will exceed $10^{19}$ atoms/cc.

2. Description of Prior Art

In the fabrication of integrated semiconductor devices it is the practice to form regions of different type conductivity within a semiconductor wafer by using a combination of photolithographic, etching, and diffusion processes. More particularly one surface of a semiconductor wafer is first coated with a diffusion masking layer, a photosensitive resist coating applied on the masking layer, and the photosensitive resist coating exposed through a photomask. The unexposed or exposed portions of the photosensitive coating, depending on the type of resist, are then removed in a developing and fixing process and the exposed regions of the masking layer removed by etching. Thereafter an impurity for a semiconductor is diffused into the semiconductor wafer through the etched openings in the masking layer.

The impurity can be diffused into the semiconductor from either the vapor phase or the solid phase. In the vapor phase diffusion a number of techniques are known. One technique involved heating the masked semiconductor wafer in a sealed capsule containing a source of the impurity which will vaporize upon heating. Such a technique for introducing As into silicon is described in U.S. Pat. No. 3,658,606 entitled "Diffusion Source and Method for Producing Same". Another technique utilizing vapor phase diffusion involves placing the masked wafer into a heated diffusion chamber and flowing a dopant through the tube on a carrier gas, typically nitrogen or argon. While vapor phase diffusion techniques are widely known and utilized they are conventionally batch type techniques involving relatively complex measures for quality control, i.e., obtaining uniform diffusion concentrations depths in the semiconductor wafer.

In diffusing an impurity into a semiconductor from the solid phase a layer of material incorporating the desired dopant is deposited on the wafer surface which has been previously masked. Many techniques are known for forming the solid layer incorporating the dopant. One such improved diffusion technique utilizing a "paint-on source" is disclosed and claimed in commonly assigned patent application Ser. No. 12,573 entitled "Method of Forming Doped Silicon Oxide Layers on Substrates and Paint-on Compositions Useful in Such Methods", now abandoned.

In diffusing semiconductor impurities from the solid difficulty has been experienced in producing diffused regions having high surface concentrations, particularly in diffusing arsenic into silicon. This invention is intended to alleviate this problem.

SUMMARY OF THE INVENTION

It is an object of this invention to provide an improved method for diffusing an impurity into a semiconductor from the solid phase.

Another object of this invention is to provide a method for diffusing As into silicon from the solid phase in relatively high concentrations such that the surface concentration is equal to or in excess of $10^{19}$ atoms/cc As.

Yet another object of this invention is to provide an improved method for utilizing a paint-on type As diffusion source.

In accordance with the aforementioned objects, the invention is a process for diffusing As into a monocrystalline silicon substrate forming diffused regions having a surface impurity concentration in excess of $10^{19}$ atoms/cc of As.

In one embodiment of the glass layer embodying As is formed on a silicon substrate in direct contact with the surface thereof, the substrate and As doped layer is then heated in an oxidizing atmosphere at a sufficiently high temperature and for a length of time to form a thin $SiO_2$ layer preferably having a thickness in the range of 200 to 300 A at the interface of the substrate and glass layer, and subsequently heating the substrate in an inert atmosphere to diffuse the As from the glass layer into the substrate to the desired depth. In another embodiment a composite layer is formed on the silicon substrate, the composite layer consisting of glassy As doped layer and an underlying $SiO_2$ layer. The substrate is then heated to diffuse the As into the substrate.

BRIEF DESCRIPTION OF THE DRAWINGS

The foregoing and other objects, features, and advantages of the invention will be apparent from the following more particular description of preferred embodiments of the invention as illustrated in the accompanied drawings.

DESCRIPTION OF PREFERRED EMBODIMENTS

This invention is an improved method for diffusing As into silicon from the solid phase, i.e., from an As doped glassy layer on the silicon substrate. In fabricating integrated circuit semiconductor devices it is necessary to form diffused regions having a high surface concentration of impurities, typically on the order of $10^{20}$ to $10^{21}$ atoms of impurity per cc. It was noted that when As was introduced into silicon by diffusion from the solid phase using known techniques, the achievement of such high surface As concentrations could not be satisfactorily achieved. It was common practice to form the doped layer and subsequently heat the wafer in an inert atmosphere in order to cause the As to diffuse into the wafer from the doped layer. Varying the As concentration in the layer and utilizing different heating temperatures failed to overcome the aforementioned problem. It is theorized by the inventor that during the heating step to diffuse the As, the As was in some way reacting with the silicon at the interface of the doped layer and silicon wafer forming a layer of material which subsequently impeded the As diffusion into the silicon. The layer is believed to be a silicon-As-$SiO_2$ compound. A preheating of the silicon wafer in an oxidizing atmosphere after the deposition of the As doped glassy layer and before the diffusion step proved to make possible the diffusion of greater As concentrations and greater diffusion depths. It is theorized that a thin interface layer of $SiO_2$ is formed which prevents the formation of the previously mentioned inhibiting layer. Experimentation indicated that the width of the $SiO_2$ layer must be in the range of 200 to 1,000 A. This range is very important since if the layer is too thin it fails to prevent formation of the inhibiting layer. Alternately if the $SiO_2$ layer is too thick it in itself will impede As diffusion.

Figure 1:
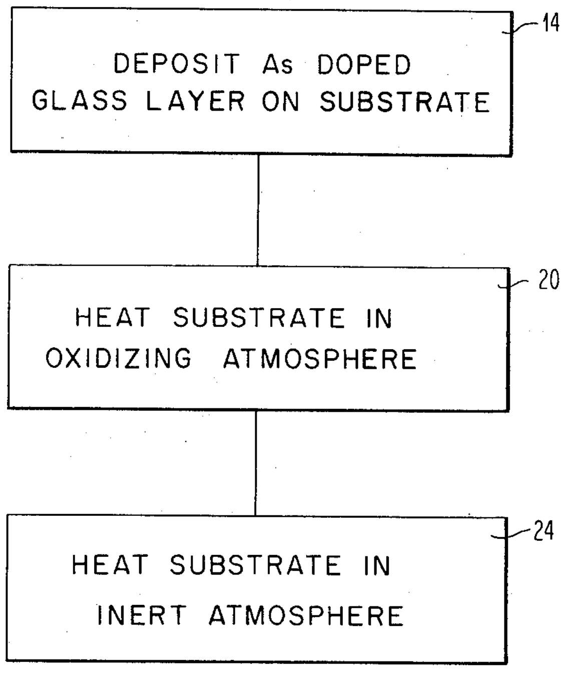
FIG. 1 is a process flow diagram illustrating a preferred embodiment of the method of the invention of forming diffused regions from an As doped layer in a silicon semiconductor substrate.
Figure 2:
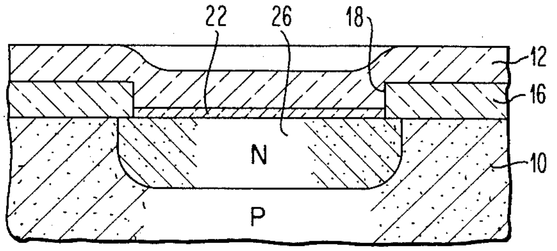
FIG. 2 is a cross-sectional view in broken section of a semiconductor illustrating the semiconductor structure associated with preferred embodiments of diffusion methods of the invention.

In practicing the method of the invention for forming As diffusions in silicon having As impurity concentrations having a surface concentration in excess of $10^{19}$ atoms/cc of As an As doped glassy layer 12 is formed on a silicon wafer 10 as shown in FIG. 2 of the drawing. The method step 14 of forming the glass layer on the substrate is indicated in the flow diagram in FIG. 1. Any suitable material can be used for the layer embodying the As dopant that will withstand a diffusion temperature in the range of 1,000° to 1250°C. Glass compositions or $SiO_2$ can be used. The glass or $SiO_2$ can be formed by spinning a suspension of glass in a liquid on the wafer and heating to fuse the particles as described in U.S. Pat. Nos. 3,212,921 or 3,212,929. Alternately the glass embodying the dopant can be deposited by pyrolytic deposition techniques or by sputter deposition. The most preferred technique is to deposit the doped layer by paint-on techniques such as described and claimed in commonly assigned application Ser. No. 12,573 entitled "Method of Forming Doped Silicon-Oxide Layers on Substrates and Paint-on Compositions Useful in Such Methods". Basically a polysiloxane polymer and an As dopant compound are formed on the wafer and the wafer heated to decompose the resultant compound into an As doped $SiO_2$ layer. More specifically a paint-on composition of a lower alkyl linear or branched siloxane polymer, as for example:

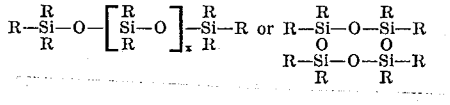

where R is an alkyl group of from one to four carbon atoms or OH radical, a hydrogen atom, a phenyl group, or a linear or branched siloxane chain, and an impurity of an organic As compound such as, triphenyl arsine oxide, triphenyl arsenic, arseno siloxanes, and arsenic esters having the formula As $[OR]_3$ where R is defined as an alkyl group. The resultant mixture is deposited on the substrate and heated to decompose the siloxane into As doped silicon oxide layer. The layer 12 is preferably deposited over a masking layer 16 having diffusion openings 18. Layer 12 can be of any suitable thickness but is preferably in the range of 1000 to 5.000 A and more preferably from 2,000 to 3,000 A. An alternate technique useful and practiced in this invention is to deposit the doped layer 12 on the surface of the wafer 10 and subsequently selectively remove portions of the layer leaving only the regions over the areas where diffused regions are desired. The fashioning of the doped regions of layer 12 can be achieved by conventional photolithographic and etching techniques, known in the art. The concentration of the As in the doped glass or $SiO_2$ layer will depend on the concentration of the desired diffusion, the nature of the glass, and also the diffusion temperature which will be used in the diffusion step. In general, however, the concentration of the dopant in the glass or $SiO_2$ will be in the range of $10^{20}$ atoms/cc to $5 \times 10^{21}$ atoms/cc.

After the As doped layer 12 is formed, the wafer is heated in an oxidizing atmosphere as indicated by step 20 in FIG. 1. The oxidizing atmosphere can be any suitable gas, more particularly $O_2$, air, or steam or mixtures thereof. The pressure is preferably atmospheric but could be otherwise if desired. The heating can be done in a suitable chamber but is preferably done in a conventional diffusion chamber having means for heating the wafer, and also supplying various types of gases or reactants. When the heating is done in a diffusion chamber, the $SiO_2$ layer can be formed and the diffusion can be done without removing the wafer from the chamber. In forming the $SiO_2$ layer the wafer is heated in the temperature range of 1,000° to 1,200°C and more particularly 1150°–1200°C. However, the temperature can be varied somewhat depending on the nature of the oxidizing atmosphere and the desired thickness of doped layer 12. Most preferably the temperature will be in the range of 1,100° to 1,200°C and the time of exposure to the oxidizing atmosphere will be sufficient to form a thin layer 22 of $SiO_2$ at the interface of wafer 10 and layer 12. The thickness of layer 22 formed beneath the glassy doped layer is most preferably in the range of 200 to 300 A. The time necessary to form layer 22 to the desired thickness depends on the temperature that the wafer is heated and the oxidizing nature of the atmosphere. However, the time will be normally in the range of 15 min. to one hour and more preferably 15–30 minutes. A general rule of thumb is that the heating period should be 15 min. per each 200 A of thickness of the glass layer 12.

The wafer is subsequently heated in an inert atmosphere as indicated by step 24 in FIG. 1 to form the diffused region 26 shown in FIG. 2. The inert atmosphere can be any suitable gas, typically nitrogen, argon, helium, $CO_2$ or mixtures thereof. Nitrogen or argon are preferred for economic reasons. The temperature can be any suitable temperature, more preferably in the range of 1,000° to 1,250°C, still more preferably in the range of 1,100° to 1,200°C. The wafer is conventionally heated on a susceptor by induction, as is well known in the art. The time of heating is dependent on the temperature, the dopant concentration in the layer 12, and also the desired diffusion depth. In general the time for the diffusion will normally be in the range of 20 min to 8 hrs. The two successive steps can be achieved by merely introducing different gases into the diffusion chamber while maintaining the heating temperature.

An alternate technique for diffusing high concentrations of As into silicon is to form the thin $SiO_2$ layer 22 prior to forming the glassy As doped layer 12. The masking layer 16 is formed as previously described. The layer 22 is then formed by suitable techniques, most preferably by thermal oxidation to a thickness in the range of 100 to 900 A, more particularly from 600 to 900 A. A thermal oxide layer having a thickness of 600 A can be formed by heating the substrate 1,100°C in oxygen for 15 min. Layer 22 can also be formed by pyrolytic deposition or RF sputter deposition as is well known in the art. After the doped glassy layer is formed as previously described, the substrate is heated at a temperature which will cause As to diffuse from layer 12 through layer 22 into substrate 10 forming diffusing region 26. The times and temperatures that are preferred are similar to those previously described as for causing diffusion of As in the inert atmosphere. The nature of the glassy doped layer 12 is similar to the structure and deposition previously described. As an alternate embodiment the composite layer of a glass doped layer 12 and a layer 22 can be formed over selective areas only. This would eliminate the use of masking layer 16.

The invention will be more readily understood from the following examples which are submitted for the purpose of illustration, it being understood that the invention is not limited thereby.

EXAMPLE I

As doped glass layers utilizing a paint-on composition, were formed on 5 *p*-type silicon wafers having a crystalline orientation such that the major surface is parallel to the <100> plane as defined by the Miller's indices. The As doped layers were prepared by spinning-on each wafer a paint-on composition consisting of 1.2 gm. of methyl-polysiloxane (80 percent $SiO_2$ content) which is a glass resin sold by Owens-Illinois under the designation type 650, 1.2 gms of As $[O-Si(C_6H_5)_2-O]_3$ As, and 10 gms. of n-butylacetate After, the spinning the wafers were heated in an ozone atmosphere at 210°C for 178 hr. to decompose the paint-on layer to doped $SiO_2$. The first wafer was then heated for 90 min. in an argon atmosphere, the second wafer was heated for 10 min. in an $O_2$ atmosphere followed by an 80 min. heating in argon atmosphere, the third 15 min. in $O_2$ followed by a 75 min. heating in argon, the fourth 30 min. in $O_2$ and 60 min. in argon and the fifth for 90 min. in an $O_2$ atmosphere. The temperature throughout the $O_2$ and argon cycles was 1,150°C. Subsequently the junction depths and the sheet resistivity of the diffused regions were determined. The thickness of the intermediate layer was estimated. The following is a table setting forth the results.

| Wafer | Diffusion Cycle at 1150°C | Sheet Resistivity | Junction Depth | Thickness of $SiO_2$ |
|---|---|---|---|---|
| 1 | 90 min Ar | 75 ± 3 ohms/sq. | 0.9 microns | O A. |
| 2 | 10 min $O_2$, 80 min Ar | 13.6 ± 0.2 ohms/sq. | 1.4 microns | 200 A. |
| 3 | 15 min $O_2$, 75 min Ar | 12.7 ± 0.4 ohms/sq. | 1.4 microns | 300 A. |
| 4 | 30 min $O_2$, 60 min Ar | 14.7 ± 0.2 ohms/sq. | 1.3 microns | 500 A. |
| 5 | 90 min $O_2$ | 17.5 ± 0.1 ohms/sq. | 1.3 microns | 1700 A. |

As the above results indicate, the junction depth was greatest in wafers 2 and 3 where the 10 and 15 min. $O_2$ pre-heating was used. Further the sheet resistivity indicating a higher impurity concentration was also the lowest in wafers 2 and 3 indicating the advantage obtained with the oxidizing heating cycle where a thin $SiO_2$ layer was formed.

EXAMPLE II

In this example, the same basic procedures were followed except that the temperature of the diffusion cycles was increased to 1,175°C. Again As doped glassy layers were formed with a paint-on source on 5 separate P type <100> silicon wafers. The heating cycles were similar as in the previous example as indicated in the following table:

| Wafer | Diffusion Cycle at 1175°C | Sheet Resistivity | Junction Depth |
|---|---|---|---|
| 1 | 90 min Ar | 55 ± 2 ohms/sq. | 1.29 microns |
| 2 | 5 min $O_2$, 85 min Ar | 13.4 ± 0.2 ohms/sq. | 1.87 microns |
| 3 | 15 min $O_2$, 75 min Ar | 9.7 ± 0.1 ohms/sq. | 1.88 microns |
| 4 | 45 min $O_2$, 45 min Ar | 12.5 ± 0.1 ohms/sq. | 1.83 microns |
| 5 | 90 min $O_2$ | 13.2 ± 0.3 ohms/sq. | 1.85 microns |

As the above data indicate, the use of an oxidizing heating cycle again increased the junction depth and lowered the sheet resistivity in the resultant diffused regions. The data also indicate that basically same results are obtained at different temperatures.

EXAMPLE III

Five P type Si wafers were selected and an As doped glassy layer formed on each with a paint-on composition as in previous examples. The diffusion time was increased to 140 min. total and the temperature was maintained at the same temperature as in Example 2. The following table indicates the data obtained:

| Wafer | Diffusion Cycle at 1175°C | Sheet Resistivity | Junction Depth |
|---|---|---|---|
| 1 | 140 min $N_2$ | 48.2 ± 0.7 ohms/sq. | 1.80 microns |
| 2 | 15 min $O_2$, 125min $N_2$ | 10.2 ± 0.1 ohms/sq. | 2.37 microns |
| 3 | 20 min $O_2$, 120min $N_2$ | 9.7 ± 0.1 ohms/sq. | 2.40 microns |
| 4 | 30 min $O_2$, 110min $N_2$ | 9.1 ± 0.1 ohms/sq. | 2.44 microns |
| 5 | 140min $O_2$ | 12.0 ± 0.2 ohms/sq. | 2.26 microns |

As the data indicate the same effects noted in the previous examples are obtained when the total heating cycle is increased.

EXAMPLE IV

In this example the intermediate $SiO_2$ layer is deposited prior to deposition of the glassy As doped layer. Four P type silicon wafers were selected. The first wafer was left bare. On the second, third and fourth wafers thermal $SiO_2$ layers of 300 A, 614 A, and 876 A were grown. An As paint-on diffusion source, as described in the previous examples, was used to deposit a doped $SiO_2$ layer on the surfaces of all four wafers. The paint-on layer was decomposed in $O_3$ for 30 min at 210°C. All the wafers were then placed in a diffusion furnace for 90 min. at 1,175°C in $N_2$. Upon removal, the sheet resistance and junction depth were measured. The following table depicts the results:

| Wafer | $SiO_2$ Layer Thickness in A | Sheet Resistivity | Junction Depth | As Surface Con Atoms/cc |
|---|---|---|---|---|
| 1 | 0 | 55.5 ± 2.2 ohms/sq. | 1.29 microns | $4.3 \times 10^{19}$ |
| 2 | 300 | 37.2 ± 0.5 ohms/sq. | 1.48 microns | $6.0 \times 10^{19}$ |
| 3 | 614 | 31.5 ± 0.4 ohms/sq. | 1.54 microns | $7.0 \times 10^{19}$ |
| 4 | 876 | 24.6 ± 0.9 ohms/sq. | 1.46 microns | $1.1 \times 10^{20}$ |

The results show that As surface concentration in silicon increases with increasing $SiO_2$ layer thickness despite the fact that the thicker oxide of $SiO_2$ at the interface inhibits the arsenic diffusion.

EXAMPLE V

In this example interface layers of $SiO_2$ and Al-silicate were compared. A layer of thermal $SiO_2$ having a thickness of 578 A was thermally grown on the first Si wafer and a layer of Al silicate glass having a thickness of 497 A was formed by $O_3$-decomposition of Al silicate paint-on source composed of 0.4 gms. glass resin type 650-Owens-Illinois and 0.2 gms. $Al[C_5H_7O_2]_3$. On both wafers an As paint-on diffusion source as previously described was deposited and densified. The resultant wafers were then heated in the diffusion furnace for 140 min. at 1,175°C in $N_2$. The following table depicts the results:

| Wafer | Layer Composition | Layer Thickness in A | Sheet Resistivity | Junction Depth |
|---|---|---|---|---|
| 1 | $SiO_2$ | 578 | 26.7 ± 0.3 ohms/sq. | 1.88 microns |
| 2 | Al silicate glass | 497 | 16.0 ± 0.1 ohms/sq. | 2.17 microns |

EXAMPLE VI

In this example the As doped oxide layer was vapor deposited on a silicon wafer by introducing $SiH_4$ and $AsH_3$ into a chamber along with oxygen and $N_2$ where the wafer was maintained at a temperature of 500°C. Subsequently, the wafer was placed in a diffusion furnace which was heated at 1,150°C. The wafer was heated for 15 min. in an oxygen atmosphere followed by a second heating cycle of 25 min. in a nitrogen atmosphere. The wafer was subsequently removed, the $SiO_2$ intermediate layer thickness was estimated to be in the range of 150 to 300 A, the sheet resistivity determined to be 32 ohms/sq. and the junction depth 1 micron. This example illustrates that the method of the invention is applicable to As doped layers deposited by pyrolytic deposition.

The data indicates that an intermediate Al silicate layer is even more effective than an $SiO_2$ layer.

While the invention has been particularly shown and described with reference to preferred embodiments thereof, it will be understood by those skilled in the art that the foregoing and other changes in form and details may be made therein without departing from the spirit and scope of the invention.

I claim:

1. A method for diffusing As into a silicon substrate forming regions having a surface impurity concentration in excess of $10^{19}$ atoms/cc comprising,
   forming a glass layer embodying As in direct contact with a silicon semiconductor substrate,
   heating the substrate and glass layer in an oxidizing atmosphere to form a thin $SiO_2$ layer at the interface of the substrate and glass layer,
   heating the substrate and layers in an inert atmosphere to diffuse As from the glass layer through the $SiO_2$ layer and into the substrate to the desired depth.

2. The method of claim 1 wherein said glass layer has a thickness in the range of 1000 to 5000 A.

3. The method of claim 1 wherein said thin $SiO_2$ has a thickness in the range of 200 to 300 A.

4. The method of claim 1 wherein said oxidizing atmosphere is a gas selected from the group consisting of oxygen, air, steam, and mixtures thereof.

5. The method of claim 4 wherein the substrate is heated in oxidizing atmosphere to a temperature in the range of 1,000° to 1200°C.

6. The method of claim 5 wherein the time of heating in the oxidizing atmosphere is of the order of 15 min. per 200 A of the glass layer.

7. The method of claim 5 wherein the substrate is heated in an inert atmosphere for a time in the range of 20 min. to 8 hrs.

8. The method of claim 4 wherein said glass layer is a paint-on layer formed by depositing a layer from a mixture of a polysiloxane, an organic arsenic compound, and a solvent, and heating the deposited layer at a temperature and for a time sufficient to decompose to an arseno silicate glass.

9. The method of claim 8 wherein said arseno silicate glass layer has a thickness in the range of 2,000 to 3,000 A.

10. The method of claim 9 wherein the arseno silicate glass layer is heated in an oxidizing atmosphere to a temperature in the range of 1,150° to 1,200°C.

11. The method of claim 10 wherein said arseno silicate glass layer is heated in the oxidizing atmosphere for a time in the range of ¼ to ½ hrs.

12. The method of claim 11 wherein said substrate is heated in an inert atmosphere at a temperature in the range of 1,100° to 1,200°C for a time in the range of 1 to 8 hrs.

13. The method of claim 12 wherein said inert atmosphere is selected from the group consisting of $N_2$, Ar, He and mixtures thereof.

14. A method for diffusing As into a silicon substrate forming diffused regions having surface impurity concentrations in excess of $10^{19}$ atoms/cc comprising,
   forming a diffusion masking layer on the substrate,
   forming diffusion windows in said masking layer,
   forming a thermal silicon oxide layer in the windows having a thickness in the range of 100–900A,
   forming an As doped layer over at least said diffusion windows,
   heating the substrate in an inert atmosphere to diffuse As from the doped layer through the silicon oxide layer and into the substrate to the desired depth.

15. The method of claim 14 wherein said As doped layer is a glass layer doped with As in a concentration in the range of $10^{20}$ to $5 \times 10^{21}$ atoms/cc.

16. The method of claim 14 wherein said As doped layer is formed by depositing a layer of a mixture of a polysiloxane, an organic arsenic compound, and a solvent, and heating the deposited layer at a temperature and for a time sufficient to decompose it to an arseno silicate glass.

17. The method of claim 16 wherein said deposited layer is heated in $O_3$.

18. A method for diffusing As into a silicon substrate forming regions having surface impurity concentrations in excess of $10^{19}$ atoms/cc comprising, forming on a silicon substrate a composite layer of an upper As doped glassy layer; and an underlying silicate layer having a thickness in the range of 100–900A by separately forming each layer, heating the substrate in an inert gaseous atmosphere selected from the group consisting of $N_2$, Ar, He and mixtures thereof at a temperature in the range of 1,000° to 1,200°C for a time sufficient to cause diffusion of As from the doped glassy layer through the silicate layer and into the silicon substrate to the desired depth.

19. The method of claim 18 wherein said silicate layer is an Al silicate glass layer.

* * * * *